United States Patent [19]

Shirai et al.

[11] Patent Number: 4,707,720
[45] Date of Patent: Nov. 17, 1987

[54] SEMICONDUCTOR MEMORY DEVICE

[75] Inventors: Koji Shirai; Ken Kawamura, both of Yokohama, Japan

[73] Assignee: Kabushiki Kaisha Toshiba, Kawasaki, Japan

[21] Appl. No.: 802,372

[22] Filed: Nov. 27, 1985

[30] Foreign Application Priority Data

Nov. 29, 1984 [JP] Japan ................................. 59-252319
Nov. 29, 1984 [JP] Japan ................................. 59-252326

[51] Int. Cl.$^4$ ...................... H01L 29/40; H01L 29/78; H01L 29/04
[52] U.S. Cl. .......................................... 357/53; 357/4; 357/23.8; 357/52; 357/59 A; 357/59 F; 357/20
[58] Field of Search ...................... 357/4, 52, 53, 59 A, 357/59 F, 20, 23.7, 23.8

[56] References Cited

U.S. PATENT DOCUMENTS

| | | | |
|---|---|---|---|
| 3,728,591 | 4/1973 | Sunshine | 317/235 |
| 3,911,473 | 10/1975 | Nienhuis | 357/238 |
| 4,041,522 | 8/1977 | Oguey et al. | 357/42 |
| 4,157,563 | 6/1979 | Bosselaar | 357/53 |
| 4,590,506 | 5/1986 | Esser | 357/53 |
| 4,622,575 | 11/1986 | Vora et al. | 357/59 A |

FOREIGN PATENT DOCUMENTS

| | | | |
|---|---|---|---|
| 0037115 | 10/1981 | European Pat. Off. | 357/23.8 |
| 49-79782 | 8/1974 | Japan | 357/52 |
| 0124161 | 7/1984 | Japan | 357/23.8 |

Primary Examiner—Andrew J. James
Assistant Examiner—D. Featherstone
Attorney, Agent, or Firm—Finnegan, Henderson, Farabow, Garrett & Dunner

[57] ABSTRACT

There is disclosed an NPN transistor comprising collector region of N conductivity type, base region of P conductivity type formed in the collector region, and emitter region of N conductivity type formed in the collector region. The collector and emitter regions define therebetween a planar PN junction. The NPN transistor further comprises a field plate electrode layer, when the transistor is viewed from above, extending from the periphery of the base region to the collector region. The field plate electrode layer comprises P conductivity semiconductor portion and N conductivity semiconductor portion. The P conductivity semiconductor portion is on the side of the base region. The N conductivity semiconductor portion is on the side of the collector region.

16 Claims, 24 Drawing Figures

FIG. 6
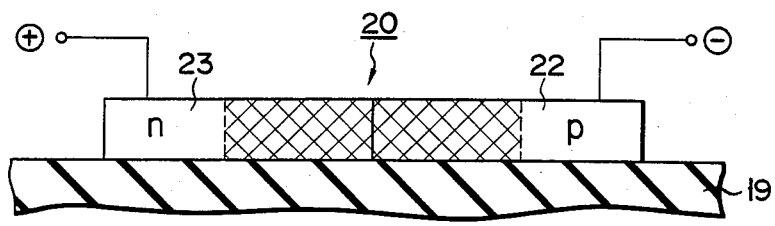
FIG. 8
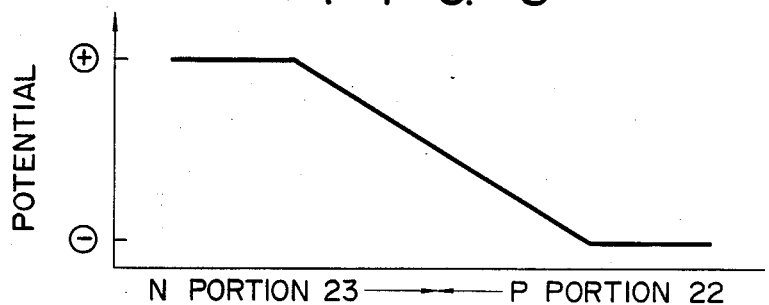
FIG. 7
FIG. 9
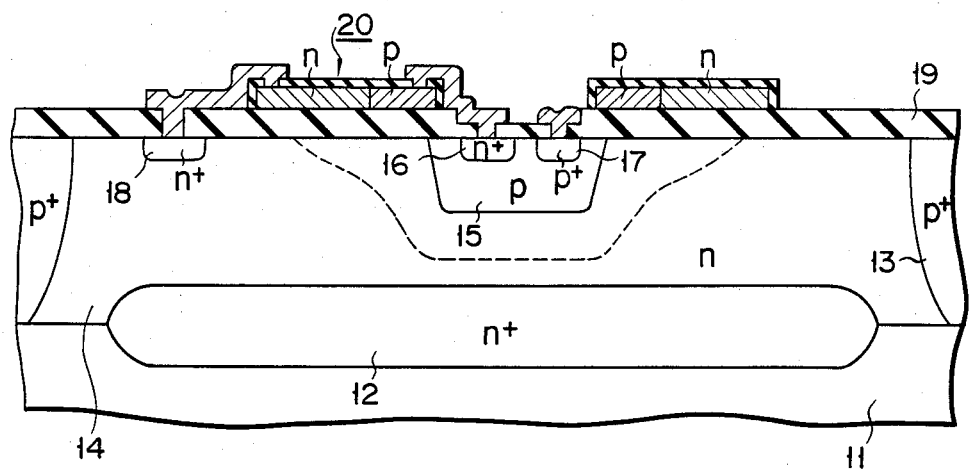

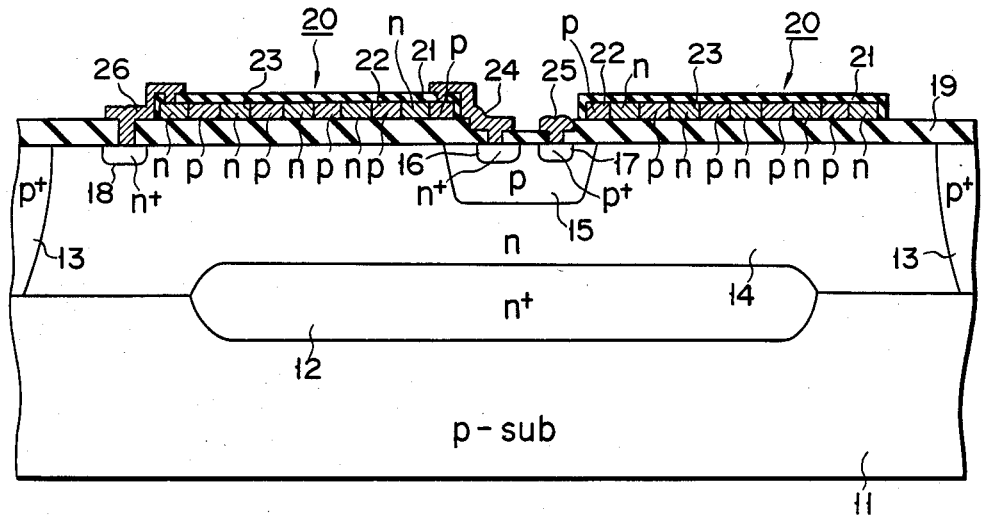
FIG. 11
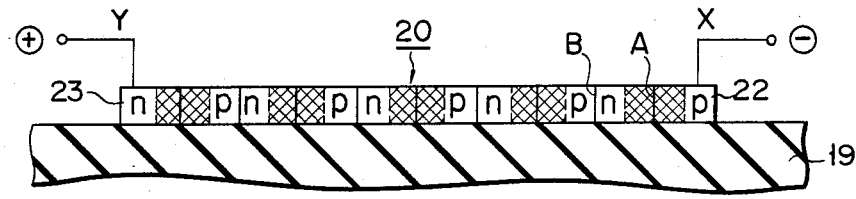
FIG. 12
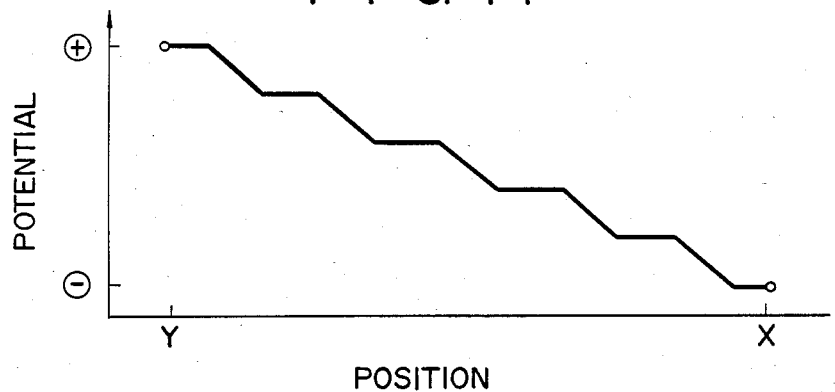
FIG. 14
FIG. 13

F I G. 15
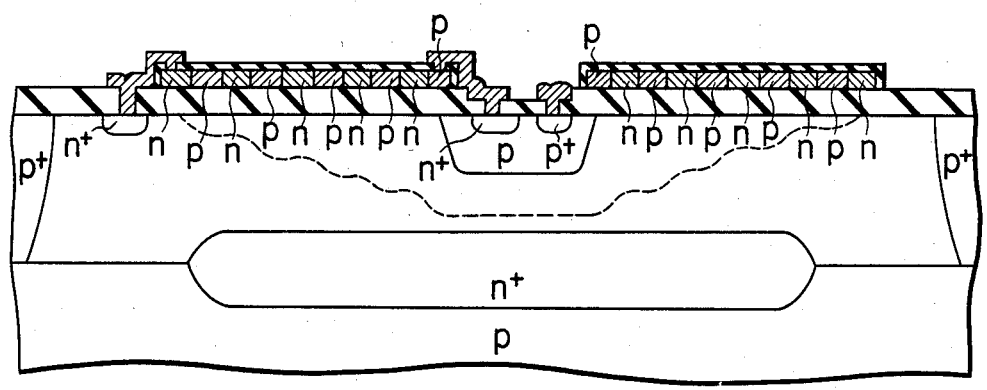
F I G. 16A
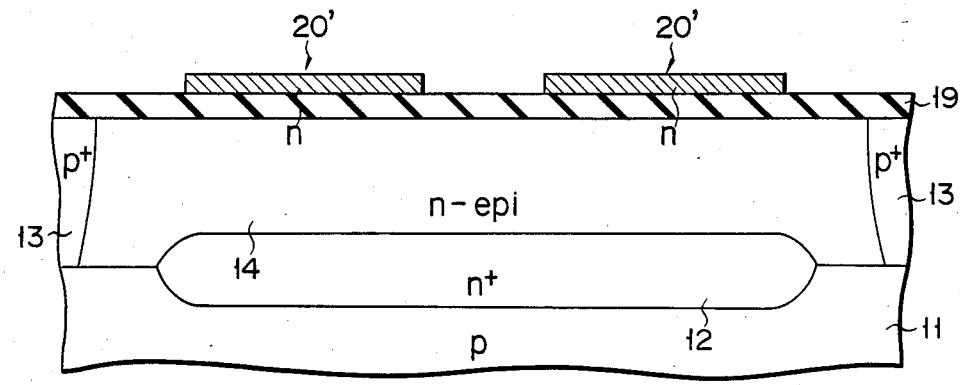
F I G. 16B
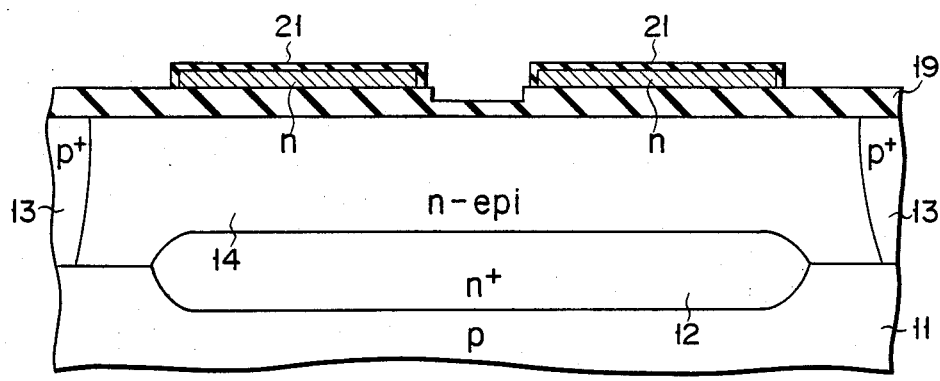

— 1 —

SEMICONDUCTOR MEMORY DEVICE

BACKGROUND OF THE INVENTION

The present invention relates to a planar semiconductor device, and, more particularly, to an improvement in a field plate electrode for increasing the junction breakdown voltage of a planar junction.

A planar semiconductor device comprises an impurity diffusion region formed by diffusing an impurity into a semiconductor layer of one conductivity type from its surface. The impurity diffusion region has a conductivity type opposite to that of the semiconductor layer. A planar junction formed between the semiconductor layer and the impurity diffusion region has an arcuated cross-section.

FIG. 1 shows a cross-section of a semiconductor structure with a planar junction. Referring to FIG. 1, impurity diffusion region 2 of P+ conductivity type is provided in silicon layer 1 of N conductivity type. Region 2 is formed by diffusing an impurity into silicon layer 1. A planar PN junction is defined between layer 1 and region 2. Silicon oxide film 3 is formed on the major surface of layer 1. When the planar junction is reverse-biased, a depletion layer is formed at the planar junction. In FIG. 1, part of the depletion layer formed only on the side of layer 1 is shown by the broken line. Generally, most part of a depletion layer is formed in a semiconductor region of a low impurity concentration, and less part is formed in a semiconductor region of a high impurity concentration. The less part of a depletion layer is very small and, therefore, can be considered to be negligible.

A disadvantage of a planar junction is that it has a low breakdown voltage. This is mainly because, when the depletion layer is viewed in cross-section, the arcuated portion is relatively sharp and the portion of the depletion layer exposed on the surface of layer 1 is relatively narrow. When the depletion layer has such an arcuated portion the electric field is concentrated at the arcuated portion, causing breakdown. Further, when the portion of the depletion layer exposed on the surface of layer 1 is narrow, an electric field is concentrated at that portion of the depletion layer, causing breakdown.

A semiconductor device with a field plate electrode, as shown in FIG. 2, has been proposed. The semiconductor device increases the area of the depletion layer exposed on the semiconductor layer 1. In the device shown in FIG. 2, field plate electrode 4 of a metal, such as aluminum, is formed on film 3. Electrode 4 extends, when viewed through film 3, from the vicinity of the junction between layer 1 and region 2 to layer 1. A negative voltage is applied to electrode 4. Electrons existing in a surface region of layer 1 are discharged into the inner region. As shown in FIG. 2, the portion of the depletion layer exposed on the surface of layer 1 is increased, thereby improving the breakdown voltage. However, the depletion layer still has sharply curved portions. Because of this, the electric field is concentrated at the curved portion and a high breakdown voltage cannot be obtained.

In order to solve this problem, a further semiconductor device has been proposed, as illustrated in FIG. 3. A high-resistance polysilicon layer is used as field plate electrode 4A. One end Y (i.e., an end away from region 2) of high-resistance polysilicon layer 4A is connected to a positive potential, and the other end X (i.e., an end near region 2) is connected to a negative potential to cause small electric current "i" to flow from end Y to end X. Electric current "i" causes a voltage drop with a moderate potential gradient, as shown in FIG. 4. For this reason, the depletion layer shows a moderate gradient and has no sharply curved portion. Thus, electric field concentration can be eliminated, and a breakdown voltage can be increased, preventing breakdown. However, flow of electric current "i" results in a considerable power consumption. Furthermore, when the above structure is applied to a transistor, the transistor will fail to operate in a small-current region.

SUMMARY OF THE INVENTION

The present invention has been made in consideration of the above situation, and the object is to provide a semiconductor device wherein a depletion layer formed at a reverse-biased planar junction shows a desired configuration so that the breakdown voltage can be increased, the power consumption can be reduced, and an operational failure can be prevented.

According to the invention, there is provided a semiconductor device comprising a first semiconductor layer of a first conductivity type, a semiconductor region of a second conductivity type formed in said first semiconductor layer, said first semiconductor layer and said semiconductor region defining therebetween a planar junction, an insulation layer formed of a predetermined pattern on said first semiconductor layer and said semiconductor region, and a second semiconductor layer formed on said insulation layer, constituting a field plate electrode layer, said second semiconductor layer, when viewed through said insulation layer, extending from the periphery of said semiconductor region to said first semiconductor layer, said second semiconductor layer comprising a first semiconductor portion of said second conductivity type and a second semiconductor portion of said first conductivity type, said first semiconductor portion being on the side of said semiconductor region, when viewed through said insulation layer, said second semiconductor portion being on the side of said semiconductor layer, when viewed through said insulation layer, and said first and second semiconductor portions defining therebetween a junction extending over the entire thickness of said second semiconductor layer.

According to the invention, there is further provided a semiconductor device comprising a first semiconductor layer of a first conductivity type, a semiconductor region of a second conductivity type formed in said first semiconductor layer, said first semiconductor layer and said semiconductor region defining therebetween a planar junction, an insulation layer of a predetermined pattern formed on said first semiconductor layer and said semiconductor region, and a second semiconductor layer formed on said insulation layer, constituting a field plate electrode layer, said second semiconductor layer, when viewed through said insulation layer, extending from the periphery of said semiconductor region to said first semiconductor layer, said second semiconductor layer comprising a plurality of first semiconductor portions of said second conductivity type and a plurality of second semiconductor portions of said first conductivity type, said first semiconductor portions and said second semiconductor portions being, when viewed through said insulation layer, alternated from the periphery of said semiconductor region towards said first semiconductor layer so that a plurality of junctions is provided therebetween, said plural junctions including a plurality of junctions each of which is defined between one of said first semiconductor portions and that one of said second semiconductor portions which is adjacent to said one of said first semiconductor portions, said one of said first semiconductor portions being on the side of said semiconductor region, when viewed through said insulation layer, said that one of said second semiconductor portions being on the side of said semiconductor layer, when viewed through said insulation layer, and said last recited plural junctions extending over the entire thickness of said second semiconductor layer.

BRIEF DESCRIPTION OF THE DRAWINGS

FIG. 6 is a sectional view showing a field plate electrode in the semiconductor device of FIG. 5;

FIG. 7 is an equivalent circuit diagram of a circuit formed by a depletion layer formed in the field plate electrode of FIG. 6;

FIG. 8 is a graph showing a potential gradient of the field plate electrode of FIG. 6;

FIG. 9 is a sectional view substantially equivalent to that of FIG. 5, but adding a depletion layer indicated by a broken line;

FIG. 11 is a sectional view of a semiconductor device according to another embodiment of the present invention;

FIG. 12 is a sectional view showing a field plate electrode in the semiconductor device of FIG. 11;

FIG. 13 is an equivalent circuit diagram of a circuit formed by a depletion layer formed in the field plate electrode of FIG. 12;

FIG. 14 is a graph showing a potential gradient of the field plate electrode of FIG. 12;

FIG. 15 is a sectional view substantially equivalent to that of FIG. 11, but adding a depletion layer indicated by a broken line;

FIGS. 16A to 16D are, respectively, sectional views of the semiconductor structures at the steps in manufacturing the semiconductor device of FIG. 11.

DETAILED DESCRIPTION OF THE PREFERRED EMBODIMENTS

Figure 1:
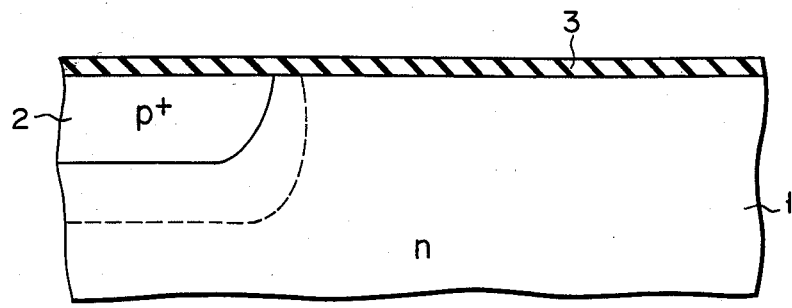
FIG. 1 is a sectional view of a conventional semiconductor structure with a planar junction.
Figure 2:
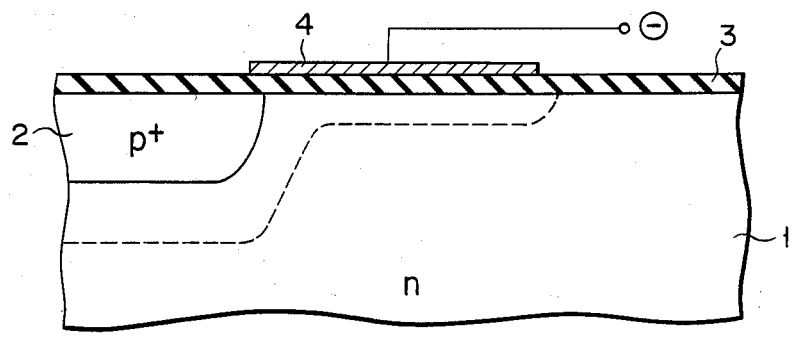
FIG. 2 is a sectional view of another conventional semiconductor structure with a planar junction.
Figure 3:
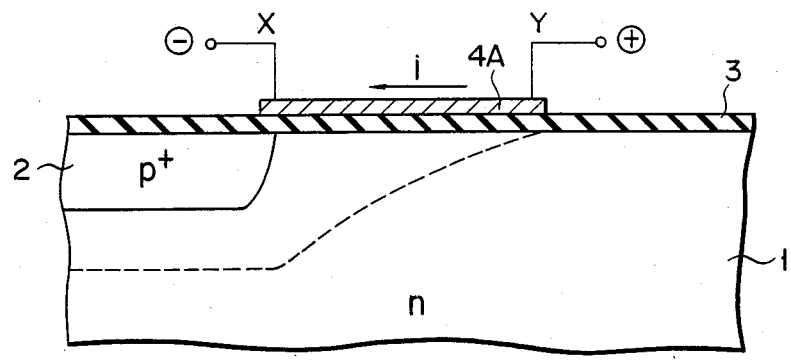
FIG. 3 is a sectional view of still another conventional semiconductor structure with a planar junction.
Figure 4:
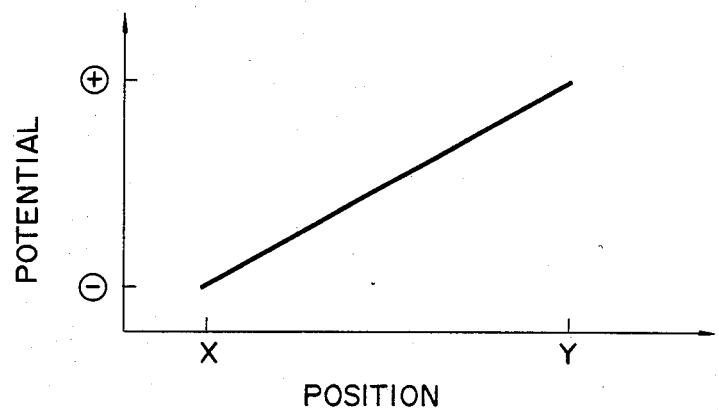
FIG. 4 is a graph showing a potential gradient of a field plate electrode in the semiconductor structure of FIG. 3.
Figure 5:
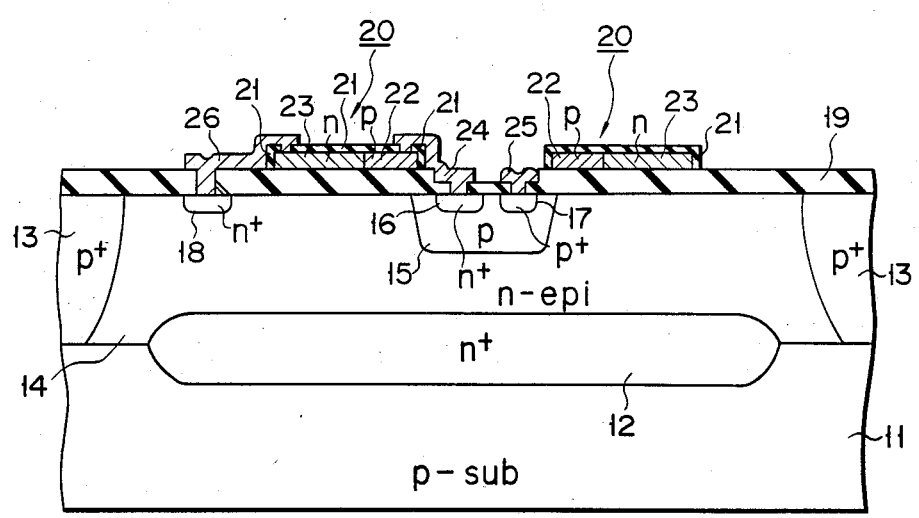
FIG. 5 is a sectional view of a semiconductor device according to an embodiment of the present invention.
Figure 10A:
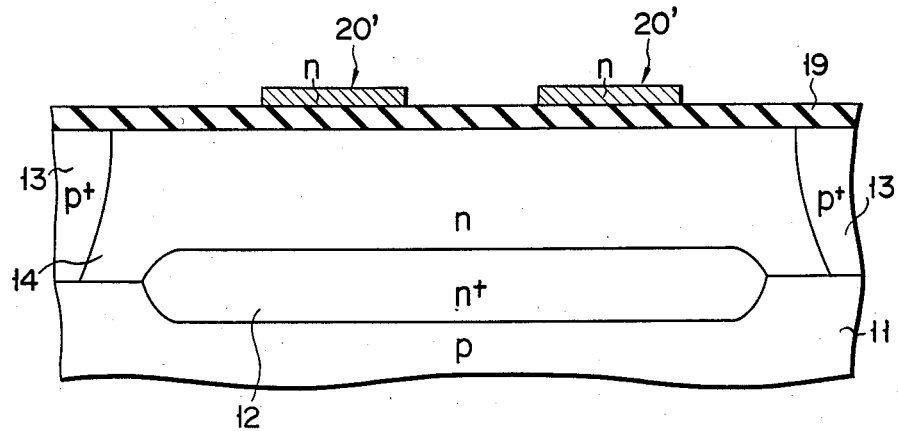
FIGS. 10A to 10D are, respectively, sectional views of the semiconductor structures at the steps in manufacturing the semiconductor device of FIG. 5.
Figure 10B:
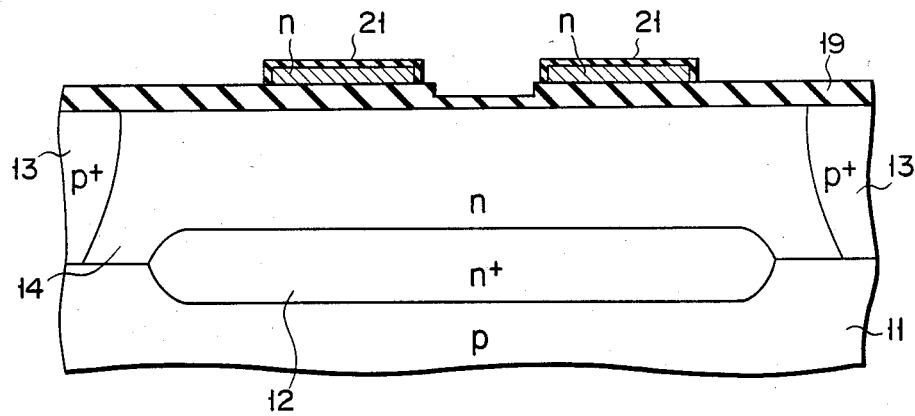
Figure 10C:
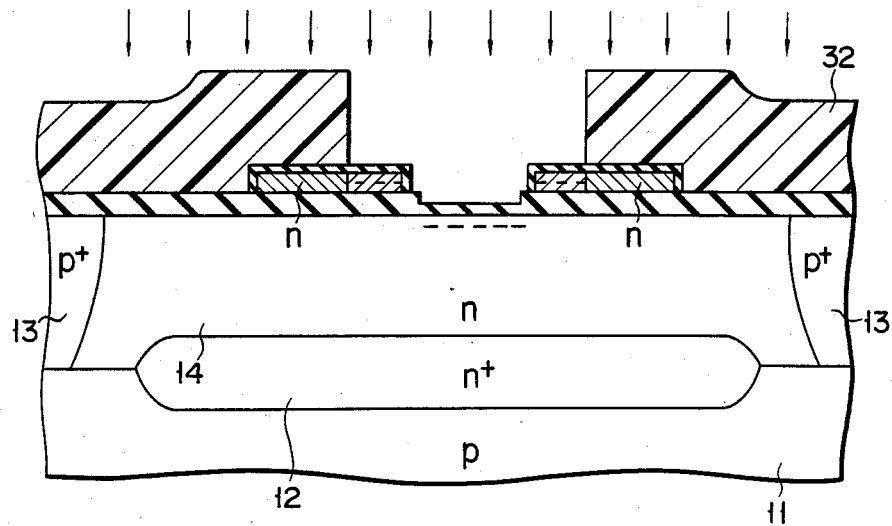
Figure 10D:
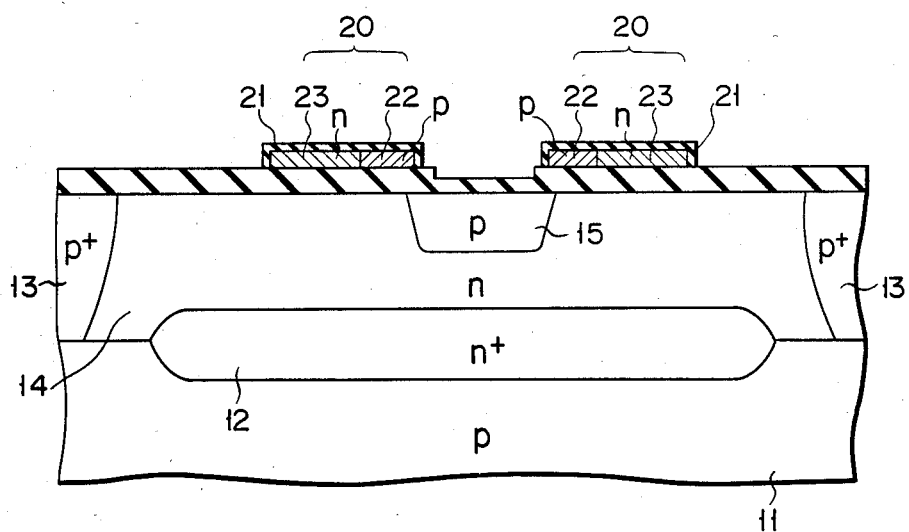
Figure 16C:
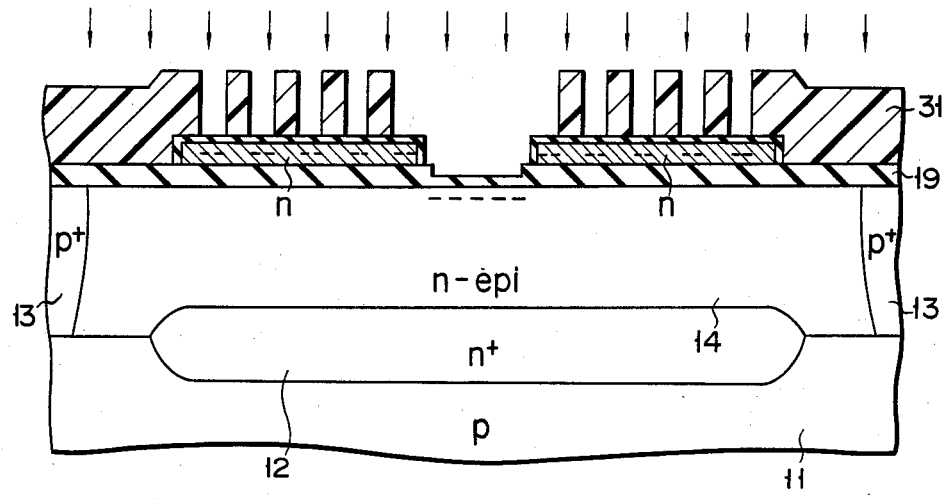
Figure 16D:
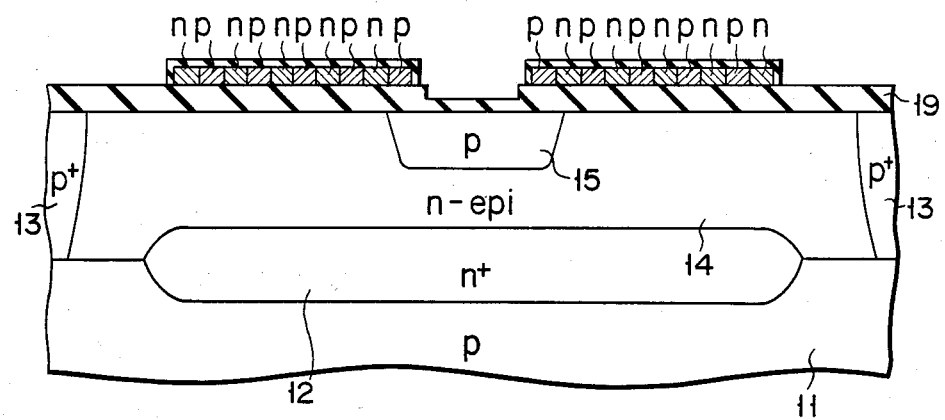

In FIG. 5, the present invention is applied to an NPN transistor. The NPN transistor comprises collector region 14, base region 15 and emitter region 16. Reference numeral 11 denotes silicon substrate of P conductivity type. Epitaxial silicon layer 14 of N conductivity type is formed on silicon substrate 11. Buried layer 12 of N+ conductivity type is formed between silicon substrate 11 and silicon layer 14. Silicon layer 14 is surrounded by separating region 13 of P+ conductivity type, thereby defining silicon layer 14 as the collector region of the NPN transistor. Separating region 13 separates the NPN transistor from other elements (not shown). Base region 15 of P conductivity type is formed in collector region 14. Collector region 14 and base region 15 define therebetween a planar PN junction. Emitter region 16 of N+ conductivity type is formed in base region 15. Base contact region 17 of P+ conductivity type is formed in base region 15. Collector contact region 18 of N+ conductivity type is formed in collector region 14.

Silicon dioxidation film 19 of a predetermined pattern is formed on the major surface of the semiconductor structure. Silicon dioxidation film 19 has contact holes leading to emitter region 16, base contact region 17 and collector contact region 18, respectively.

Polysilicon layer 20 is formed on silicon dioxidation film 19 and above collector region 14 and base region 15. Polysilicon layer 20 extends, when viewed through silicon dioxidation film 19 (i.e., when viewed from above in FIG. 5) from the periphery of base region 15 to collector region 14 (i.e., outwards). Polysilicon layer 20 constitutes a field plate electrode. Field plate electrode 20 comprises polysilicon portion 22 of P conductivity type and polysilicon portion 23 of N conductivity type. Polysilicon portion 22 is, when viewed through silicon dioxidation film 19 (i.e., when viewed from above in FIG. 5) on the side of base region 15. Polysilicon portion 23 is, when viewed through silicon dioxidation film 19 (i.e., when viewed from above in FIG. 5) on the side of collector region 14. Polysilicon portions 22 and 23 define therebetween a PN junction extending over the entire thickness of polysilicon layer 20.

Field plate electrode 20 is covered by silicon dioxidation film 21 of a predetermined pattern. Silicon dioxidation film 21 has contact holes leading to polysilicon portions 22 and 23 of field plate electrode 20, respectively.

Emitter electrode 24 is formed on silicon dioxidation film 19. Emitter electrode 24 extends onto silicon dioxidation film 21. Emitter electrode 24 extends into the emitter contact hole formed in silicon dioxidation film 19 and contacts emitter region 16. Emitter electrode 24 also extends into the P portion contact hole formed in silicon dioxidation film 21 and contacts P polysilicon portion 22 of field plate electrode 20. Base electrode 25 is formed on silicon dioxidation film 19. Base electrode 25 extends into the base contact hole formed in silicon dioxidation film 19 and contacts base contact region 17. Collector electrode 26 is formed on silicon dioxidation film 19. Collector electrode 26 extends onto silicon dioxidation film 21. Collector electrode 26 extends into the collector contact hole formed in silicon dioxidation film 19 and contacts collector contact region 18. Collector electrode 26 also extends into the N portion contact hole formed in silicon dioxidation film 21 and contacts N polysilicon portion 23 of field plate electrode 20.

When the semiconductor device shown in FIG. 5 is operated, potentials are applied to the device through electrodes 24, 25 and 26 so that the planar PN junction between regions 15 and 16 is forward-biased and the PN junction between regions 14 and 15 is reverse-biased. Therefore, a depletion layer is formed at the PN junction between regions 14 and 15. The PN junction between P portion 22 and N portion 23 of electrode 20 is also reverse-biased.

FIG. 6 shows electrode 20 with a depletion layer (indicated by a cross-hatched) formed at the PN junction between portions 22 and 23. Electrode 20 with the depletion layer is equivalent to a capacitor with the depletion layer as a dielectric, as shown in FIG. 7. Therefore, a potential gradient as shown in FIG. 8 is provided to electrode 20, although no electric current flows through electrode 20. Thus, a depletion layer is formed at the PN junction between regions 14 and 15 as shown by the dotted line in FIG. 9. The depletion layer has a smooth profile without a sharp curved portion. Therefore, breakdown does not occur, and the junction breakdown voltage can be increased. In addition, electric current need not flow through electrode 20, thus eliminating the power consumption. Since electric current does not flow through electrode 20, no operation failure occurs in a small-current region. In addition, the portion of the depletion layer contacting surface of region 14 is wide and no breakdown occurs at the portion.

A method of manufacturing the semiconductor device shown in FIG. 5 will be described with reference to FIGS. 10A to 10D.

STEP 1 (FIG. 10A)

Layers 14 and 12 and region 13 are sequentially formed on semiconductor substrate of P conductivity type by conventional known techniques. The surface of layer 14 is oxidized at a temperature of 1,100° C. for 60 minutes to form film 19 of 6,000 ÅA. Subsequently, a polysilicon layer of N conductivity type is deposited by CVD to a thickness of 5,000 ÅA and is patterned to form polysilicon pattern 20' as electrode 20.

STEP 2 (FIG. 10B)

The prospective base region of film 19 is selectively etched by photolithography, and dry oxidation is performed at a temperature of 1,100° C. to form thin (e.g., 1,000 ÅA) oxide film 21 on the surface of pattern 20'.

STEP 3 (FIG. 10C)

Resist pattern 32 is formed on the major surface of the structure. Pattern 32 has an opening through which the base region 15 and prospective portion 22 of electrode 20 are exposed. Boron ions are implanted using pattern 32 as a mask, thereby doping the prospective base and P regions with boron ions.

STEP 4 (FIG. 10D)

Pattern 32 is removed, and the resultant structure is annealed to activate the doped boron ions. Base region 15 and portion 22 of electrode 20 are thus formed.

Thereafter, regions 16, 17 and 18 are formed by a known impurity diffusion technique, and electrodes 24, 25 and 26 are formed by aluminum deposition and patterning, thereby preparing a bipolar semiconductor device with the structure of that in FIG. 5.

FIG. 11 shows another embodiment of the present invention. The structure of this embodiment is substantially the same as that of FIG. 5 except that field plate electrode 20 has alternately formed P and N portions 22 and 23. The same reference numerals as in FIG. 11 denote the same parts as in FIG. 5, and a description thereof is omitted.

Also in the embodiment of FIG. 11, when the semiconductor device is operated, potentials are applied to the device through electrodes 24, 25 and 26, so that a plurality of reverse-biased and forward-biased PN junctions are formed between a plurality of P and N portions 22 and 23 in electrode 20. The detail is shown in FIG. 12. Each of the reverse-biased PN junction is constituted, when the device is viewed from the top, by given N portion 23 located near region 15 and P portion 22 located outside given N portion 23, i.e., near region 14. Each of the reverse-biased PN junctions is constituted, when the device from the top, by P portion 22 located near base region 15 and N portion 23 located outside given P portion 22, i.e., near region 14. In other words, reverse- and forward-biased PN junctions are alternately formed from region 15 to region 14. Although a depletion layer is formed in the forward-biased junction, a potential gradient is small and can be neglected.

Field plate electrode 20 with depletion layers of the reverse-biased junctions is equivalent to series-connected capacitors. The depletion layers serve as dielectrics, as shown in FIG. 13. Therefore, electrode 20 has a potential gradient, as shown in FIG. 14, although no electric current flows through electrode 20. Its potential changes stepwise slightly. Therefore, a depletion layer of a slight stepwise profile is formed at the PN junction between regions 14 and 15 as shown by the dotted line in FIG. 15. Thus, a breakdown does not occur and the junction breakdown voltage is increased. In addition, since no electric current flows through electrode 20, the power consumption does not occur. Furthermore, an operation failure in the small-current region. The portion of the depletion layer contacting the surface of region 14 is wide so that a breakdown in this portion does not occur.

A method of manufacturing the semiconductor device shown in FIG. 11 will be described with reference to FIGS. 16A to 16D.

STEP 1 (FIG. 16A)

Layers 14 and 12 and region 13 are sequentially formed by conventional known techniques. The surface of layer 14 on semiconductor substrate of P conductivity type is oxidized at a temperature of 1,100° C. for 60 minutes to form film 19 of 6,000 Å. Subsequently, a polysilicon layer of N conductivity type is deposited by CVD to a thickness of 5,000 ÅA and is patterned to form polysilicon pattern 20' as electrode 20.

STEP 2 (FIG. 16B)

The prospective base region of film 19 is selectively etched by photolithography, and dry oxidation is performed at a temperature of 1,100° C. to form thin (e.g., 1,000 ÅA) oxide film 21 on the surface of pattern 20'.

STEP 3 (FIG. 16C)

Resist pattern 34 is formed on the major surface of the structure. In this case, pattern 34 has a plurality of openings. One of the openings exposes to prospective base region 15 and prospective portions 22 of electrode 20. Others of the openings expose to prospective P portions 22 of electrode 20. Boron ions are implanted using pattern 34 as a mask, thereby doping the prospective base and P regions with boron ions.

STEP 4 (FIG. 16D)

Pattern 34 is removed, and the resultant structure is annealed to activate the doped boron ions. Base region 15 and portions 22 of electrode 20 are thus formed.

Thereafter, regions 16, 17 and 18 are formed by a known impurity diffusion technique, and electrodes 24, 25 and 26 are formed by aluminum deposition and patterning, thereby preparing a bipolar semiconductor device with the structure of that in FIG. 11.

Figure 17:
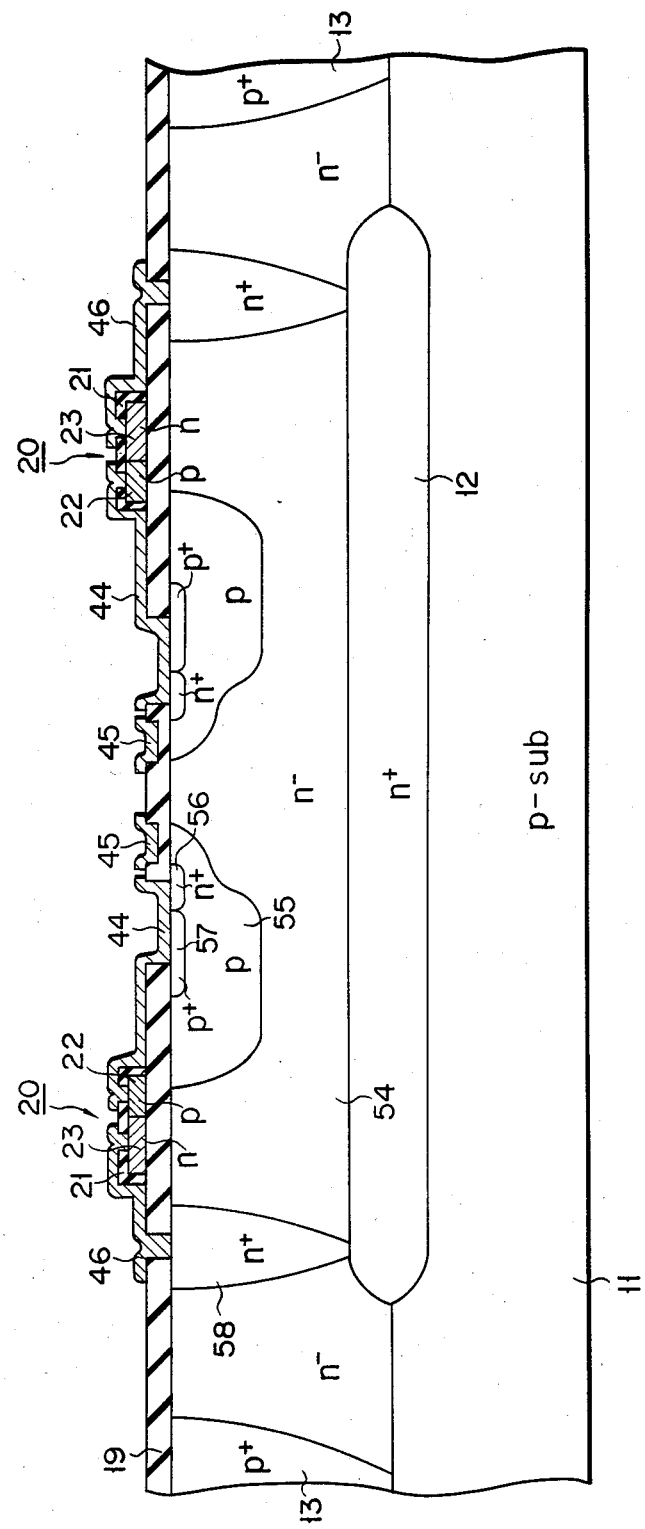
FIGS. 17 and 18 respectively show sectional views of semiconductor devices according to other embodiments of the present invention.

FIG. 17 shows a further embodiment of the present invention.

In FIG. 17, the present invention is applied to an N channel MOS transistor. The same reference numerals as in the FIGS. 5 and 11 denote the same parts as in FIGS. 5 and 11, and a description thereof is omitted.

The MOS transistor comprises drain region 54, back-gate region 55 and source region 56. The MOS transistor further comprises drain contact region 58 of N+ conductivity type contacting buried region 12 and back-gate contact region 57 of P+ conductivity type. Silicon layer 54 is surrounded by separating region 13 of P+ conductivity type, thereby defining silicon layer 54 as the drain region of the MOS transistor. Separating region 13 separates the MOS transistor from other elements (not shown). Back-gate region 55 is formed in drain region 54. Drain region 54 and back-gate region 55 define therebetween a planar PN junction. Source region 56 of N+ conductivity type is formed in back-gate region 55. Back-gate contact region 57 is formed in base region 55. Drain contact region 58 is formed in drain region 54.

Silicon dioxidation film 19 has contact holes leading to source region 56, back-gate contact region 57 and drain contact region 58, respectively.

Polysilicon layer or field plate electrode 20 is formed on silicon dioxidation film 19 and above drain region 54 and back-gate region 55. Polysilicon layer 20 extends, when viewed through silicon dioxidation film 19 (i.e., when viewed from above in FIG. 17) from the periphery of back-gate region 55 to drain region 54 (i.e., outwards). Field plate electrode 20 comprises polysilicon portion 22 of P conductivity type and polysilicon portion 23 of N conductivity type. Polysilicon portion 22 is, when viewed through silicon dioxidation film 19 (i.e., when viewed from above in FIG. 17) on the side of back-gate region 55. Polysilicon portion 23 is, when viewed through silicon dioxidation film 19 (i.e., when viewed from above in FIG. 17) on the side of drain region 54. Polysilicon portions 22 and 23 define therebetween a PN junction extending over the entire thickness of polysilicon layer 20.

Field plate electrode 20 is covered by silicon dioxidation film 21 of a predetermined pattern. Silicon dioxidation film 21 has contact holes leading to polysilicon portions 22 and 23 of field plate electrode 20, respectively.

Source electrode 44 is formed on silicon dioxidation film 19. Source electrode 44 extends onto silicon dioxidation film 21. Source electrode 44 is common to back-gate electrode. Source electrode 44 extends into the source contact hole formed in silicon dioxidation film 19 and contacts source region 56 and back-gate contact region 57. Source electrode 44 also extends into the P portion contact hole formed in silicon dioxidation film 21 and contacts P polysilicon portion 22 of field plate electrode 20. Gate electrode 45 is formed on silicon dioxidation film 19 and above the channel region. The channel portion is the surface portion of back-gate region 55, which is between drain region 54 and source region 56. Drain electrode 46 is formed on silicon dioxidation film 19. Drain electrode 46 extends onto silicon dioxidation film 21. Drain electrode 46 extends into the drain contact hole formed in silicon dioxidation film 19 and contacts drain contact region 58. Drain electrode 46 also extends into the N portion contact hole formed in silicon dioxidation film 21 and contacts N polysilicon portion 23 of field plate electrode 20.

When the semiconductor device shown in FIG. 17 is operated, potentials are applied to the device through electrodes 44, 45 and 46 so that the planar PN junction between regions 55 and 56 is forward-biased and the PN junction between regions 54 and 55 is reverse-biased. Therefore, a depletion layer is formed at the PN junction between regions 54 and 55. The PN junction between P portion 22 and N portion 23 of electrode 20 is also reverse-biased.

Electrode 20 with the depletion layer is equivalent to a capacitor with the depletion layer as a dielectric. Therefore, a smooth potential gradient is provided on electrode 20, although no electric current flows through electrode 20. Thus, a depletion layer is formed at the PN junction between regions 54 and 55, with a smooth profile without a sharp curved portion.

Therefore, substantially the same results as those in the embodiments of FIGS. 5 and 11 are provided. That is, a breakdown does not occur, and the junction breakdown voltage can be increased. In addition, electric current need not flow through electrode 20, thus eliminating the power consumption. Since electric current does not flow through electrode 20, no operation failure occurs in a small-current region.

Gate electrode 45 and field plate electrode 20 can be formed at a same step by patterning a same polysilicon layer.

Figure 18:
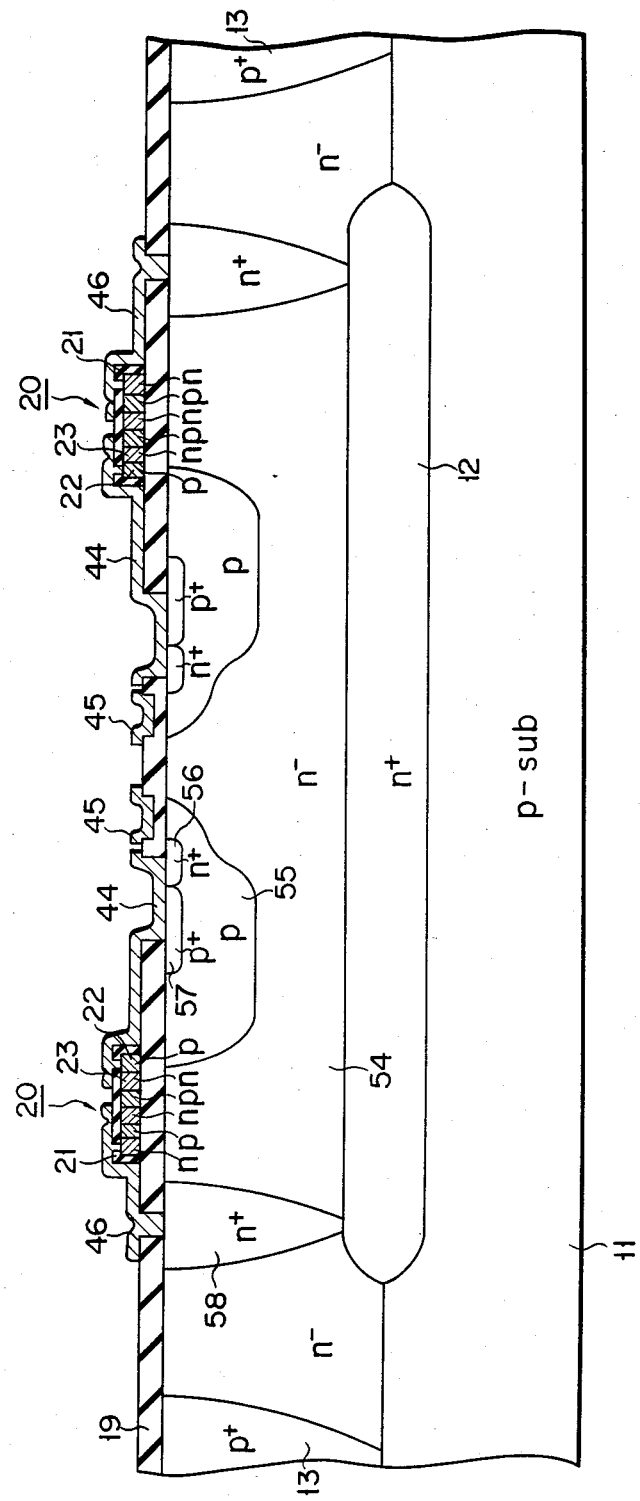

FIG. 18 shows a still further embodiment of the present invention. The structure of this embodiment is substantially the same as that of FIG. 17 except that field plate electrode 20 has alternately formed P and N portions 22 and 23. The same reference numerals as in FIG. 17 denote the same parts as in FIG. 18, and a description thereof is omitted.

Also in the embodiment of FIG. 18, when the semiconductor device is operated, potentials are applied to the device through electrodes 44, 45 and 46, so that a plurality of reverse-biased and forward-biased PN junctions are formed between a plurality of P and N portions 22 and 23 in electrode 20. Each of the reverse-biased PN junction is constituted, when the device is viewed from the top, by given N portion 23 located near back-gate region 55 and P portion 22 located outside given N portion 23, i.e., near drain region 54. Each of the reverse-biased PN junctions is constituted, when the device from the top, by P portion 22 located near back-gate region 55 and N portion 23 located outside given P portion 22, i.e., near region 54. In other words, reverse- and forward-biased PN junctions are alternately formed from back-gate region 55 to drain region 54.

Field plate electrode 20 with depletion layers of the reverse-biased junctions is equivalent to series-connected capacitors. The depletion layers serve as dielectrics. Therefore, the potential gradient on electrode 20 changes stepwise slightly, although no electric current flows through electrode 20. Therefore, a depletion layer of a slight stepwise profile is formed at the PN junction between regions 54 and 55.

Therefore, substantially the same results as those in the embodiments of FIGS. 5, 11 and 17 are provided. That is, a breakdown does not occur and the junction breakdown voltage is increased. In addition, since no electric current flows through electrode 20, the power consumption does not occur. Furthermore, since electric current does not flow through electrode 20, no operation failure occurs in a small-current region.

Gate electrode 45 and field plate electrode 20 can be formed at a same step by patterning a same polysilicon layer.

As is apparent from the above description, the field plate electrode is made of at least one P portion and at least one N portion. The P portion near the impurity diffusion region and the semiconductor layer away from the P portion are reverse-biased, so that the depletion layer formed at the PN junction shows a smooth profile without a sharply curved portion and the portion of the depletion layer contacting the surface of the semiconductor layer is wide. Therefore, a breakdown does not occur. As a result, a semiconductor device having a high breakdown voltage can be provided. Furthermore, since no electric current flows through field plate electrode, and the power consumption does not occur. No operation failure also occurs in a small-current region.

What is claimed is:

1. A semiconductor device comprising:
   a first semiconductor layer of a first conductivity type:
   a semiconductor region of a second conductivity type formed in said first semiconductor layer, said first semiconductor layer and said semiconductor region defining therebetween a planar junction;
   an insulation layer of a predetermined pattern formed on said first semiconductor layer and said semiconductor region; and
   a second semiconductor layer formed on said insulation layer, constituting a field plate electrode layer, said second semiconductor layer, when viewed through said insulation layer, extending outwardly from the periphery of said semiconductor region to overlay a portion of said first semiconductor layer, said second semiconductor layer including a first semiconductor portion of said second conductivity type and a second semiconductor portion of said first conductivity type, said first semiconductor portion being disposed adjacent to said semiconductor region, when viewed through said insulation layer, said second semiconductor protion being disposed adjacent to said first semiconductor layer, when viewed through said insulation layer, said first and second semiconductor portions defining therebetween a junction extending through the entire thickness of said second semiconductor layer, and said junction defined between said first and second semiconductor portions, when viewed through said insulation layer, overlaying said first semiconductor layer outside said semiconductor region.

2. A semiconductor device according to claim 1, further comprising a second semiconductor region of said first conductivity type formed in said first recited semiconductor region, said second semiconductor region and said first semiconductor region defining therebetween a junction.

3. A semiconductor device according to claim 2, in which said first semiconductor layer constitutes the collector region of a bipolar transistor, said first semiconductor region constitutes the base region of said bipolar transistor, and said second semiconductor region constitutes the emitter region of said bipolar transistor.

4. A semiconductor device according to claim 1, further comprising:
   a first electrode for connecting said semiconductor region and said first semiconductor portion and a second electrode for connecting said first semiconductor layer and said second semiconductor portion; and
   in which said planar junction defined between said first semiconductor layer and said semiconductor region is reverse biased through said first and second electrodes, and said junction defined between said first semiconductor portion and said second semiconductor portion is reverse biased through said first and second electrodes.

5. A semiconductor device according to claim 2, further comprising:
   a first electrode for connecting said second semiconductor region and said first semiconductor portion, a second electrode for connecting said first semiconductor layer and said second semiconductor portion, and a third electrode contacting said first recited semiconductor region; and
   in which said planar junction defined between said first semiconductor layer and said first recited semiconductor region is reverse biased through said first and second electrodes, said junction defined between said first semiconductor portion and said second semiconductor portion is reverse biased through said first and second electrodes, and said junction defined between said first recited semiconductor region and said second semiconductor region is forward biased through said first and third electrodes.

6. A semiconductor device according to claim 1, in which said second semiconductor layer is made of polysilicon.

7. A semiconductor device according to claim 2, in which said first semiconductor layer constitutes the drain region of a MOS transistor, said first recited semiconductor region constitutes the back-gate region of said MOS transistor, and said second semiconductor region constitutes the source region of said MOS transistor.

8. A semiconductor device according to claim 7, further comprising a gate electrode formed on said insulation layer and above that portion of said back-gate region which is between said first semiconductor layer and said second semiconductor region, said gate electrode being provided at a same step for forming said second semiconductor layer by patterning a same semiconductor layer.

9. A semiconductor device comprising:
   a first semiconductor layer of a first conductivity type;
   a semiconductor region of a second conductivity type formed in said first semiconductor layer, said first semiconductor layer and said semiconductor region defining therebetween a planar junction;
   an insulation layer of a predetermined pattern formed on said first semiconductor lyer and said semiconductor region; and
   a second semiconducctor layer formed on said insulation layer, constituting a field plate electrode layer, said second semiconductor layer, when viewed through said insulation layer, extending outwardly from the periphery of said semiconductor region to overlay a portion of said first semiconductor layer, said second semiconductor layer comprising a plurality of first semiconductor portions of said second conductivity type and a plurality of second semiconductor portions of said first conductivity type, said first semiconductor portions and second semiconductor portions, when viewed through said insulation layer, being alternately disposed from the periphery of said semiconductor region outwardly toward said first semiconductor layer for providing a plurality of junctions therebetween, each of said plural junctions being defined between adjacent first and second semiconductor portions each said first semiconductor portion being disposed toward said semiconductor region, when viewed through said insulation layer, each said second semiconductor portion being disposed toward said first semiconductor layer, when viewed through said insulation layer, said plural junctions extending over the entire thickness of said second semiconductor layer, and said plural junctions defined between said first and second semiconductor portions being, when viewed through said insulation layer, above said first semiconductor layer and outside said semiconductor region.

10. A semiconductor device according to claim 9, further comprising a second semiconductor region of said first conductivity type formed in said first recited semiconductor region, said second semiconductor region and said first semiconductor region defining therebetween a junction.

11. a semiconductor device according to claim 10, in which said first semiconductor layer constitutes the collector region of a bipolar transistor, said first semiconductor region constitutes the base region of said bipolar transistor, and said second semiconductor region constitutes the emitter region of said bipolar transistor.

12. A semiconductor device according to claim 9, further comprising:
a first electrode for connecting said semiconductor region and one of said first semiconductor portions, said a second electrode for connecting said first semiconductor layer and one of said plural second semiconductor portions, which, when viewed through said insulation layer, is situated further from said semiconductor region than is said one of the first semiconductor portions; and
in which said planar junction defined between said first semiconductor layer and said semiconductor region is reverse biased through said first and second electrodes, and said plural junctions defined between said first semiconductor portions and said second semiconductor portions are reverse biased through said first and second electrodes.

13. A semiconductor device according to claim 10, further comprising:
a first electrode for connecting said semiconductor regions and one of said first semiconductor portions and a second electrode for connecting said first semiconductor layer and one of said second semiconductor portions, which, when viewed through said insulation layer, is situated further from said semiconductor regions than is said one of the first semiconductor portions;
and in which said planar junction defined between said first semiconductor layer and said first recited semiconductor region is reverse biased through said first and second electrodes, and said plural junctions defined between said first semiconductor portions and said second semiconductor portions are reverse biased through said first and second electrodes, and said junction defined between said first recited semiconductor region and said second semiconductor region is forward biased through said first and second electrodes.

14. A semiconductor device according to claim 9, in which said second semiconductor layer is made of polysilicon.

15. A semiconductor device according to claim 10, in which said first semiconductor layer constitutes the drain region of a MOS transistor, said first recited semiconductor region constitutes the back-gate region of said MOS transistor, and said second semiconductor region consitutes the source region of said MOS transistor.

16. A semiconductor device according to claim 15, further comprising a gate electrode formed on said insulation layer and above that portion of said back-gate region which is between said first semiconductor layer and said second semiconductor region, said gate electrode being provided at a same step for forming said second semiconductor layer by patterning a same semiconductor layer.

* * * * *

UNITED STATES PATENT AND TRADEMARK OFFICE
CERTIFICATE OF CORRECTION

PATENT NO. : 4,707,720

DATED : November 17, 1987

INVENTOR(S) : SHIRAI ET AL.

It is certified that error appears in the above-identified patent and that said Letters Patent is hereby corrected as shown below:

Claim 1, column 9, line 44, "protion" should be --portion--.

Claim 9, column 10, line 62, "semi-conducctor" should be --semiconductor--.

Claim 11, column 11, line 31, "a" should be --A--.

Signed and Sealed this

Twenty-seventh Day of September, 1988

Attest:

DONALD J. QUIGG

Attesting Officer

Commissioner of Patents and Trademarks